United States Patent [19]

Bretschneider et al.

[11] Patent Number: 6,149,254
[45] Date of Patent: Nov. 21, 2000

[54] EQUIPMENT CABINET

[75] Inventors: Rainer Bretschneider, Meissen; Joerg Schwaebe, Gruna; Thomas Willkommen, Meissen, all of Germany

[73] Assignee: Knuerr-Mechanik fuer die Elektronik Aktiengesellschaft, Munich, Germany

[21] Appl. No.: 09/270,770

[22] Filed: Mar. 17, 1999

[30] Foreign Application Priority Data

Mar. 19, 1998 [DE] Germany ................... 198 12 117

[51] Int. Cl.[7] ............................................. A47B 81/00
[52] U.S. Cl. .................. 312/223.1; 312/213; 312/236
[58] Field of Search ........................ 312/223.1, 400, 312/403, 406, 40.1, 236, 213

[56] References Cited

U.S. PATENT DOCUMENTS

| | | | |
|---|---|---|---|
| 3,364,838 | 1/1968 | Bradley | 312/213 |
| 4,010,349 | 3/1977 | Lee | 312/236 X |
| 4,089,322 | 5/1978 | Guibert | 312/236 X |
| 4,654,308 | 3/1987 | Safi et al. | 312/236.1 X |
| 4,800,734 | 1/1989 | Sauber et al. | 312/236 X |
| 5,118,173 | 6/1992 | Proctor et al. | 312/213 |
| 5,500,028 | 3/1996 | Iizuka | 312/223.1 X |

FOREIGN PATENT DOCUMENTS

WO 97/48261  12/1997  WIPO .

*Primary Examiner*—Peter M. Cuomo
*Assistant Examiner*—Stephen Vu
*Attorney, Agent, or Firm*—Evenson, McKeown, Edwards & Lenahan, P.L.L.C.

[57] ABSTRACT

An equipment cabinet for electrical and electronic equipment and components is provided with a functional area, which is surrounded by multishell walls and at least one door and is terminated in dustproof and watertight manner. A functional area wall is positioned between an outer wall and an inner guide wall and is provided with a rib system, in order to ensure a particularly good heat removal from the functional area. The rib system is in the form of rib rails, which are provided with a plurality of ribs and ports.

19 Claims, 5 Drawing Sheets

EQUIPMENT CABINET

FIELD OF THE INVENTION

The present invention relates to an equipment cabinet for electrical and electronic equipment and components with a functional area, which is surrounded in a dustproof and watertight manner by walls and at least one door, in which the walls have a multishell construction with at least an outer wall, a functional area wall with a rib system and an inside guide wall.

DESCRIPTION OF RELATED ART

WO 97/48261 discloses an equipment cabinet, which can be used as a switch or control cabinet. A functional area is constructed in a dustproof and watertight manner and is surrounded by multishell walls and at least one door closing in dustproof and watertight manner. The equipment cabinet is designed for different climatic zones and has a functional area wall, which is positioned between an outer wall and an inside guide wall and is provided with a rib system, e.g. in the form of needles. The rib system projects into an inner channel, which is bounded by the functional area wall and the inside guide wall formed by guide surfaces or side walls of slide-in modules, and an outer channel, which is constructed between the functional area wall and the outer wall.

A first fluid flow passes in circuit form through the functional area and the inner channel with the aid of at least one fan and is cooled on the functional area wall with the rib system. The cooling of the functional area wall and the needles inserted in a heat-conducting manner takes place with an outer fluid flow flowing in the outer channel, and in particular a cold or ambient air flow which, in a load-dependent manner, is sucked through at least one fan and passes out in the vicinity of a cabinet cover.

The needles projecting into the inner and outer channels increase the surface of the functional area wall and improve the convective heat transfer and therefore the cooling or temperature control of the functional area.

The known equipment cabinet ensures a controllable heat dissipation without expensive, space-consuming cooling devices. However, the manufacture of the rib system increases costs. For thermohydraulic reasons the needles generally have a diameter of less than one to a few millimeters and must be inserted in the functional area wall with a high occupation or coverage density, i.e. with a transverse and longitudinal spacing in the millimeter range. As the functional area wall is generally constructed as an EMC-shielded, dustproof and water vapour-tight wall, there is a risk of the rib system, e.g. on the insertion of the needles, no longer ensuring the necessary sealing effect and EMC-shielding.

SUMMARY OF THE INVENTION

The object of the invention is to provide an equipment cabinet, in which the cooling and temperature control of a functional area takes place in an extremely efficient manner with the aid of a rib system and which can simultaneously be manufactured and operated in an inexpensive manner.

According to the invention, the object is achieved through a rib system which is constructed in form of rib rails with a plurality of ribs and ports for a fluid flow.

According to the invention, numerous ribs and ports, which lead to turbulence of a fluid flow and to a better heat transfer, are constructed on a strip-like or rail-like element, which in a prefabricated form can be fitted to one or appropriately both sides of a functional area wall.

An advantage of the inventive rib rails or strips is that they have a plurality of ribs and ports and can be fixed by means of a few through holes in the functional area wall or e.g. by means of bonding, welding, soldering or clinching thereto.

The rib rails can fundamentally be arranged in any direction, i.e. vertically, horizontally or in sloping form. It is generally appropriate to fix them in a horizontal arrangement to the inside and/or outside of a functional area wall. In order to obtain a particularly good heat transfer, the functional area wall can be provided with rib rails over virtually its entire height and width and the individual rib rails can have a unitary length or different lengths and can be lined up or can be adapted to the height or width of a functional area side wall and a functional area rear wall.

The rail-like or strip-like ribs system element with a plurality of ribs and ports is in a particularly advantageous variant constructed as a U-profile or U-section and can be inexpensively manufactured from a sheet metal blank, which only has to undergo a punching and bending process.

U-shaped rib rails have in a horizontal arrangement lower and upper rail arm withs ribs and ports, together with a central web, which engages in a vertical orientation in heat-conducting manner on the inside and/or outside of the functional area wall.

The rib rails can be juxtaposed or superimposed with a random spacing. It can be appropriate to adapt the spacing to the height of the central web.

Another advantage of the rib rails is that a plurality of shapes and arrangements of the ribs and ports is possible, with which it is possible to obtain a particularly good turbulence and a high heat transfer coefficient on the functional area wall. The ribs and ports of the lower and upper rail arms can be aligned with one another or can also be mutually displaced. The ports can be formed by punched out portions or by slots or incisions and subsequent bends about a rotation axis. Moreover, roughly rectangular punching areas can be bent or angled up or down in gill-like manner about a longitudinal side bending edge. The ports are then advantageously provided with direction webs, which ensure a planned turbulence and improved cooling or temperature control.

The dimensions of the U-shaped rib rail, particularly the width of the horizontally positoned rail arms is defined by the dimensions of the inner and/or outer channel of the equipment cabinet and the necessary cooling capacity. The rail arms can extend up to the inside guide wall or to the outer wall and ensure a particularly heat removal.

The width of the rail arms of the individual rib rails can vary over the equipment cabinet height and can be matched to the packing density of the functional area. Apart from a U-shaped or C-shaped rib rail or strip, it is also possible to use a L-shaped rib rail or strip, which on a vertical fixing web only has one rail arm with ribs and ports.

A U- or C-shaped rib rail can also be constructed as a double rib rail comprising ribs of two rail arms and additional middle ribs. The ribs of the rail arms and the middle ribs can be formed by a punching and bending process and the double rib rails can be fixed in the area of a central web.

In a particularly inexpensive construction U-shaped or L-shaped rib rails can be produced from a perforated metal sheet, which can have random hole shapes as ports and webs as ribs. The holes of a rail arm can be aligned with those of the underlying or overlying rail arm or can be displaced with respect thereto. The central web can be free from holes or also provided with holes. In place of a perforated metal sheet it is also possible to use a sieve netting, particularly in the vicinity of the rail legs or arms.

Rib rails, which are preferably suitable for a vertical arrangement, have ribs displaced in the flow direction, which are formed by marginal recesses, e.g. marginal slots, said marginal recesses extending up to a displaced bending edge. The spaces between the wide sides of the ribs are constructed as ports and the rib spacings transversely arranged to the flow direction are different. The rib rail is then step-like constructed and can have differently high ribs and slots formed by marginal recesses.

Another variant of a rib rail has a fixing web, which extends virtually over the entire width of a functional area wall and which is provided with a plurality of pins as ribs. The pins can be fixed by a joining process to the fixing web, which is constructed in plate-like manner. The pins can also have a nail-like construction and different cross-sections, e.g. a circular, square, rectangular or polygonal cross-section.

The pins can also have a streamlined construction and can be fixed in aligned or displaced manner, with an identical or differing transverse and longitudinal spacing to the fixing web.

The rib rail according to the invention is not limited to use in equipment cabinets and can instead be used for casings and modular chassis, which in particular have a load-dependent cooling. The rib rails and double rib rails can also be used on devices having boundary walls in one or two parts, in order to achieve an inexpensive, efficient heat dissipation. Another advantageous use is in heat exchangers.

BRIEF DESCRIPTION OF THE DRAWINGS

The invention is described in greater detail hereinafter relative to the attached drawings.

DESCRIPTION OF THE PREFERRED EMBODIMENTS

Figure 1:
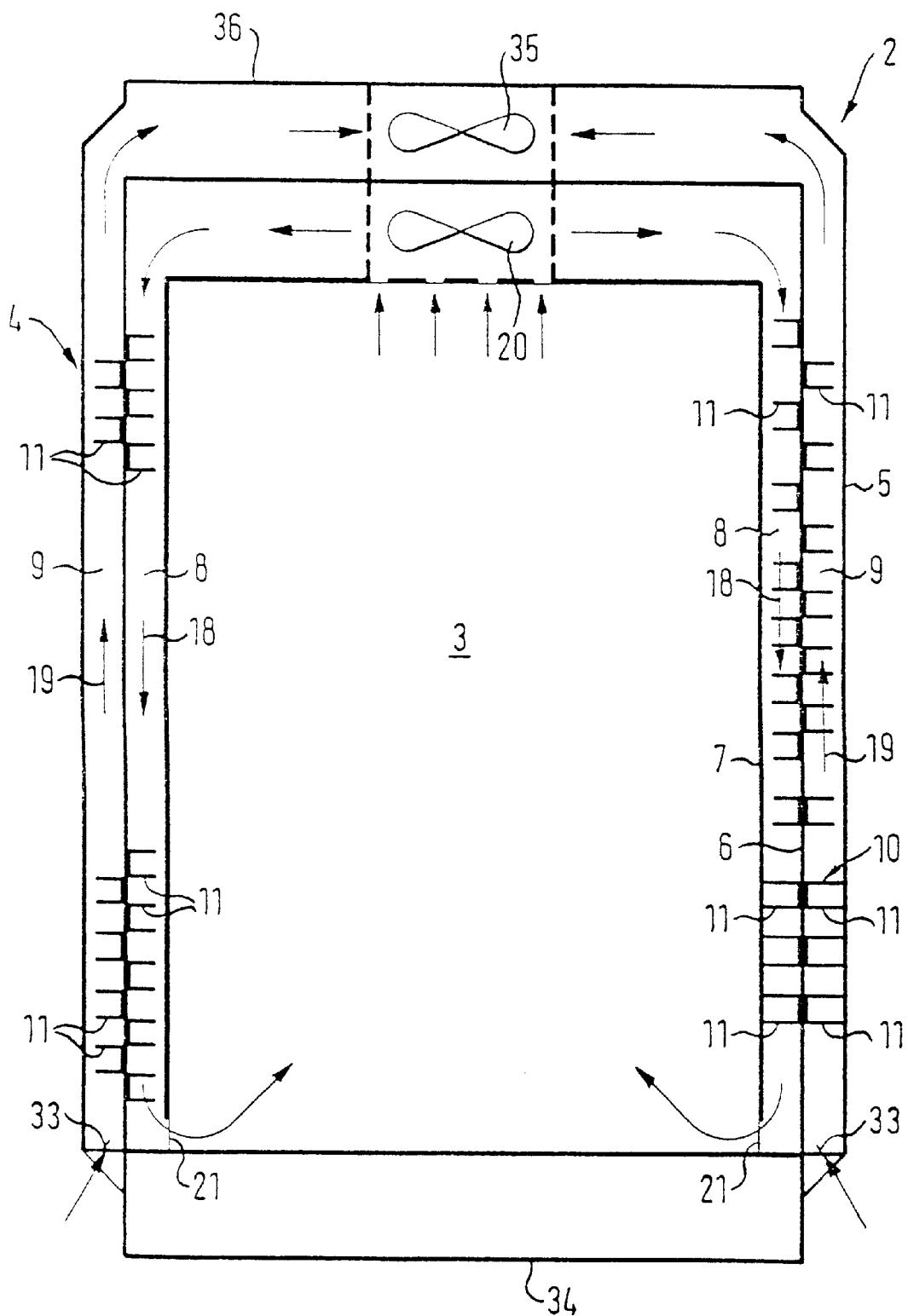
FIG. 1 is a longitudinal section through an equipment cabinet according to the invention.

FIG. 1 shows an equipment cabinet 2 with a functional area 3, which is surrounded by walls 4 and at least one not shown door and is constructed in dustproof and watertight, as well as EMC-shielded manner.

The walls 4 have a multishell construction and have in each case an outer wall 5, a functional area wall 6 and an inside guide wall 7, which can be formed by not shown guide plates and/or side walls of not shown slide-in modules. Between the inside guide wall 7 and functional area wall 6 is formed an inner channel 8 for a circulating fluid flow 18, which is passed with the aid of an exhaust fan 20, via bottom inlet openings 21 through the functional area 3 in order to remove the heat produced by equipments, assemblies, etc. (not shown).

A cooling or temperature control of the fluid flow 18 takes place in the vicinity of the functional area wall 6, which is provided with a rib system 10. The rib system 10 of the functional area wall 6 is in the form of rib rails 11 U-shaped constructed and fixed horizontally to the inside and outside of the functional area wall 6.

The rib rails 11 shown and arranged in exemplified manner in the left and right inner channel 8 and outer channel 9 have possible variants. The left-hand side of the equipment cabinet 2 has displaced rib rails 11, which do not take up the entire cross-section of the inner channel 8 and outer channel 9, but are instead spaced with respect to the inner guide wall 7 and outer wall 5.

The rib rails 11 in the lower area of the right-hand inner channel 8 and outer channel 9 are fixed at the same height to the functional area wall 6 and extend up to the inner guide wall 7 or outer wall 5. As a result of the direct contact, there is also a heat conduction besides a turbulent flow of the fluid, which brings about a particularly good cooling of the fluid flow 18 in the inner channel 8. The rib rails 11 in the right inner channel 8 and outer channel 9 located in an upper area are arranged in mutually displaced, differently spaced manner.

Generally, the rib rails in the inner channels 8 and outer channels 9 of the functional area side walls and a functional area rear wall are constructed and arranged in a unitary manner. However, it is fundamentally possible to fix differently constructed rib rails 11 to the functional area wall 6 and to vary the spacings of the rib rails 11 over the height of the equipment cabinet 2 and e.g. match same to the packing density of the functional area 3.

The cooling of the functional area wall 6 with its inside and outside rib rails 11 takes place by a fluid flow 19, which is sucked in by means of closable openings 33 close to a cabinet base 34 with the aid of an exhaust fan 35 and is passed through the outer channel 9 from bottom to top and through the rib rails 11. The exhaust fans 20, 35 can be controlled in load-dependent manner, so that the volume flows 18, 19 in inner channel 8 and outer channel 9 can be set or adjusted in accordance with the heat quantity to be removed from the functional area 3 and the temperature of the ambient air in the outer channel 9. It is additionally possible to remove by means of not shown lamellas in a cover 36 of the equipment cabinet 2 the cooling air in the outer channel 9. Inner and outer channel 8, 9 can also serve for insulation and be operated without an air or fluid circulation.

Figure 2:
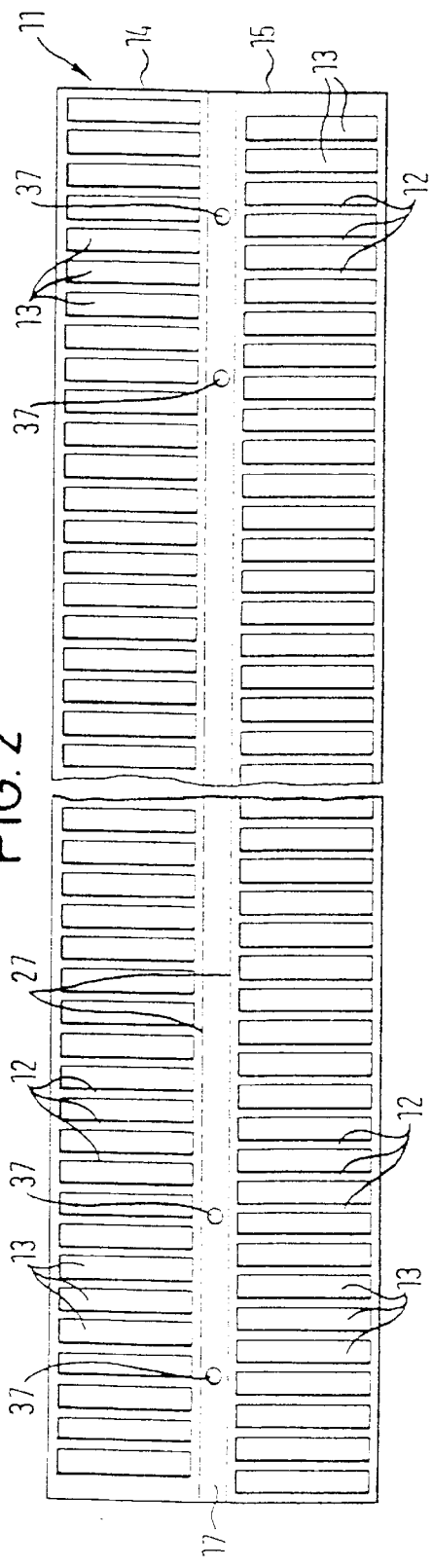
FIG. 2 is a plan view of a rib rail after punching and before bending.

FIGS. 2 to 5 show a preferred construction of a rib rail 11, which is shown in a larger representation in FIG. 2 after a punching process, but before a bending process.

The profile rail 11 is constructed as a U-profile and has a plurality of ribs 12 and through openings or ports 13. The ribs 12 and ports 13, which in this embodiment are formed by punched-out portions, are arranged in displaced manner in a lower rail arm 14 compared with an upper rail arm 15, so that stronger turbulence of the fluid flow and a better heat exchange are obtained. The fixing of the rib rail 11 constructed as a U-profile takes place in the area of a central web 17, which is vertically oriented and engages on the outside or inside of the functional area wall 6. In the present embodiment the rib rail 11 is fixed by means of four fixing areas 37 (cf. FIGS. 2 and 5).

Figure 3:
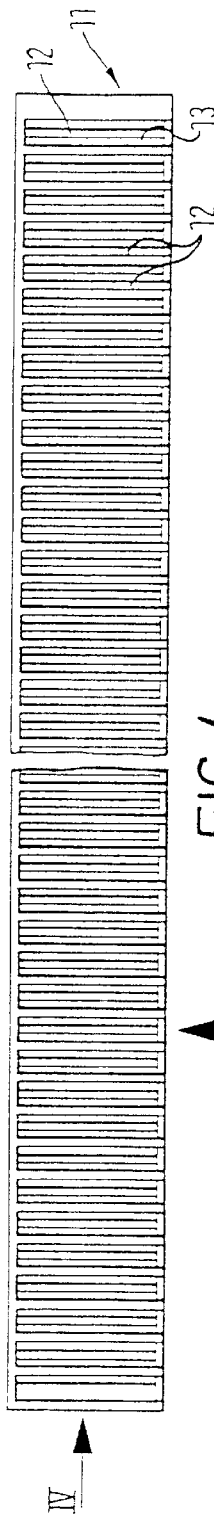
FIG. 3 is a plan view of a rib rail according to FIG. 2 following the punching and bending process.

The punched-out profile rail 11 according to FIG. 2 reveals in broken line form the subsequent bending edges 27. FIGS. 2 and 3 make it clear that the ports 13 extend over virtually the entire width of the rail arms 14, 15. However, in diverging manner, in the rail arms 14, 15 can be formed one or more crossbars, if this should be advantageous from the thermohydraulic standpoint.

Figure 4:
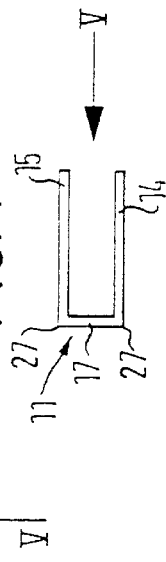
FIG. 4 is a side view of the rib rail along arrow IV in FIG. 3.
Figure 5:
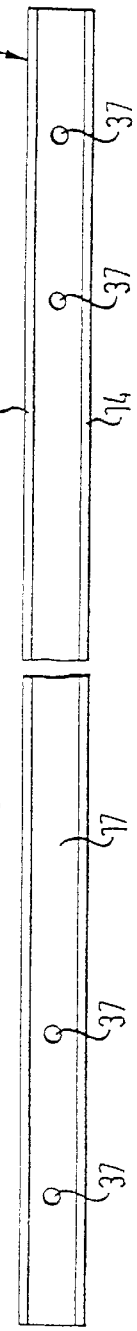
FIG. 5 is a view of the rib rail along arrow V in FIGS. 3 or 4.
Figure 6:
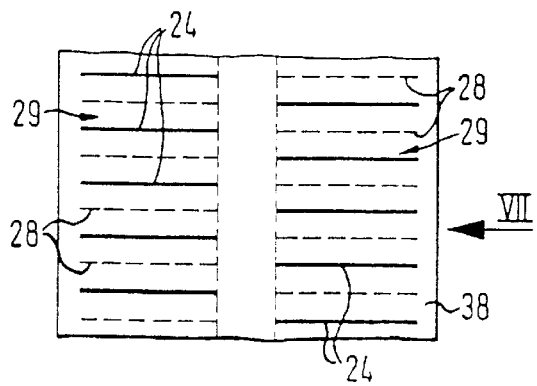
FIG. 6 is a plan view of a detail of a rib rail after making slots and prior to the bending process.

It is possible to gather from FIG. 4 that the profile rail 11 can be constructed in L-shaped or C-shaped manner.

Figure 7:
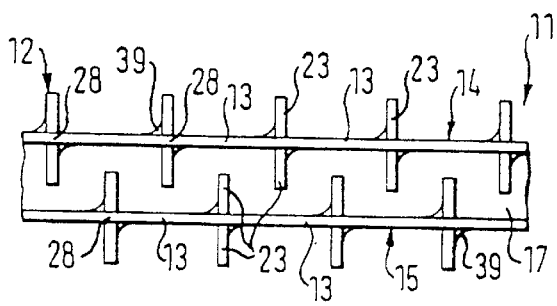
FIG. 7 is a view of the rib rail along arrow VII in FIG. 6, but after the bending process.

The following FIGS. 6 to 17 show further variants of a rib rail 11. The detail of a cut-to-size metal sheet 38 for a rib rail 11 shown in FIG. 6 has slots or incisions 24. In a subsequent bending process punched areas 29 between the slots or incisions 24 are turned about a rotation axis 28 in the flow direction and direction webs 23 as ribs 12 are oriented in a virtually vertical manner (FIG. 7). Particularly good turbulence is obtained through a displaced construction of the ports 13 and direction webs 23. Side webs 39 are formed by the slots or incisions 24 in the vicinity of the ports 13.

Figure 8:
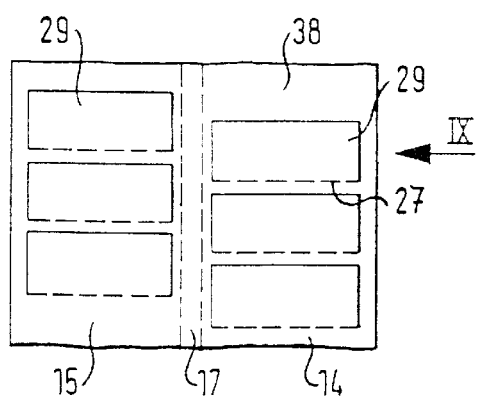
FIG. 8 is a plan view of a detail of a rib rail after punching and before bending.
Figure 9:
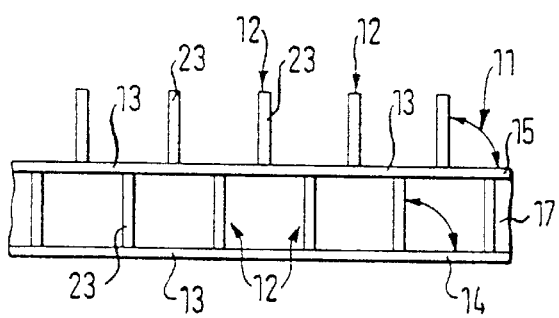
FIG. 9 is a plan view of the rib rail along arrow IX according to FIG. 8, but after the bending process.

According to FIG. 8 a metal sheet 38 for a profile rail 11 with ribs 12 and ports 13 according to FIG. 9 is provided with punched areas 29, which are bent up in gill-like manner about a bending edge 27. The thus constructed direction webs 23 as ribs 12 and ports 13 on the lower rail arm 14 and upper rail arm are once again displaced and have an opening angle of almost 90°.

Figure 10:
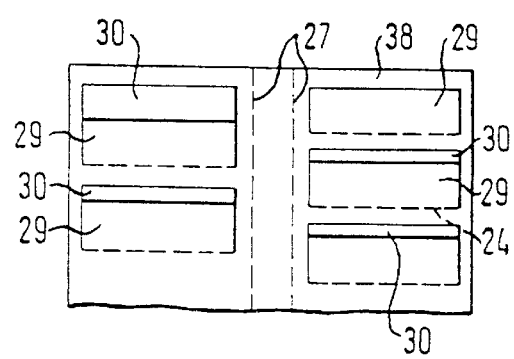
FIG. 10 is a plan view of another variant of a rib rail after the punching process and before the bending process.

FIG. 10 shows another variant of a metal sheet 38 for a rib rail 11. The punched areas 29 formed by a punching process also have punched-out portions 30, so that following the bending process in which they are bent up in the flow direction and the metal sheet 38 is bent in U-shaped manner along the dot-dash bending edges 27, they have different heights.

The variants for ribs 12 or direction webs 23 and ports 13 shown in FIGS. 6 to 10 can also be constructed in the case of C and L-shaped profile rails.

Figure 11:
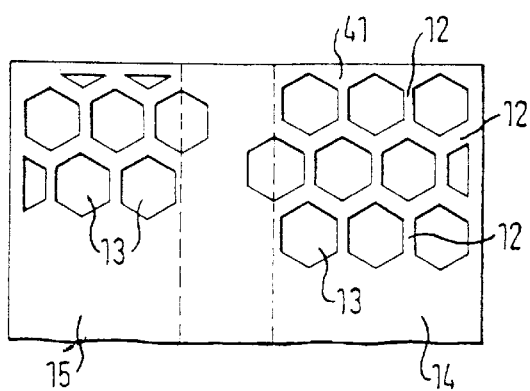
FIG. 11 is a plan view of a perforated metal sheet for a rib rail before the bending process.

FIG. 11 shows in detail a perforated metal sheet 41, which is cut to size for a U-shaped rib rail 11 and in the vicinity of the rail arms 14, 15 is provided with a plurality of holes as ports 13 and webs as ribs 12. The central web 12 in the embodiment according to FIG. 11 is constructed in a compact form and virtually with no ports 13. Fundamentally, holes or ports 13 can also be provided in this area.

Figure 12:
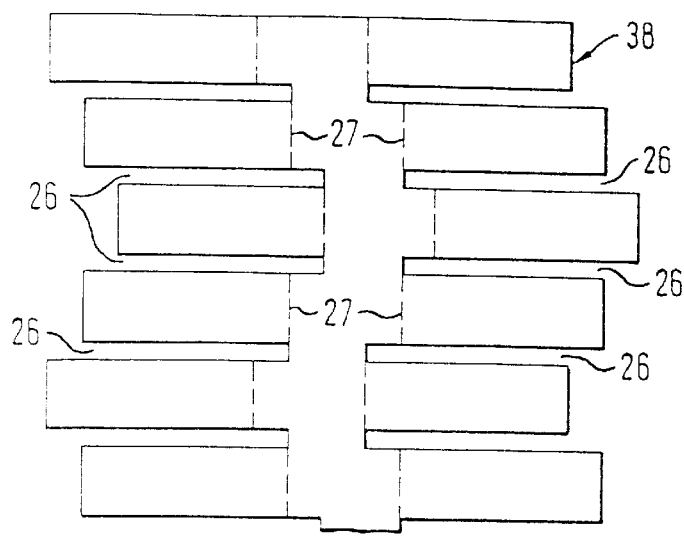
FIG. 12 is a plan view of another variant of a profile rail after punching and before bending.
Figure 14:
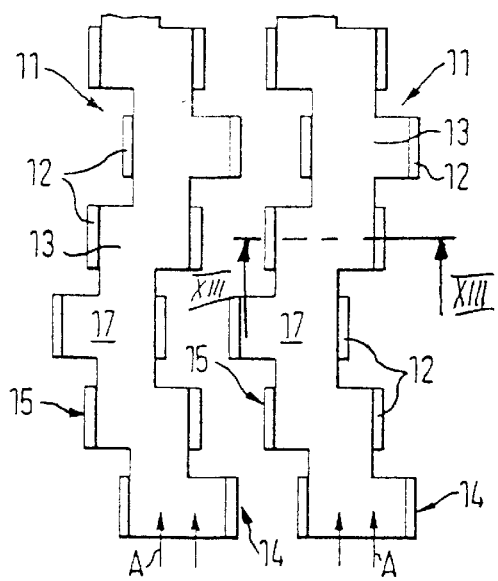
FIG. 14 is a plan view of two juxtaposed profile rails according to FIG. 12 after the bending process.
Figure 13:
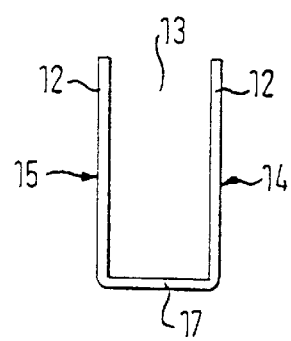
FIG. 13 is a side view of a profile rail along line XIII—XIII in FIG. 14.

FIG. 12 shows a detail of a sheet metal blank 38 for a U-shaped profile rail 11 according to FIGS. 13 and 14, which is positioned vertically. To facilitate understanding, in FIG. 14 two such profile rails 11 are juxtaposed. Ribs 12 are formed by marginal recesses 26, which in each case extend up to a displaced bending edge 27, and ports 13 are formed by spaces between the ribs 12, which are offset in the flow direction (arrows A). The profile rails 11 have stepped rail arms 14, 15 with ribs 12 and are arranged complementary to one another in FIG. 14.

Alternatively to U, C or L-shaped profile rails it is also possible to form rib rails 11 with ribs 12 and ports 13 by pins 32, which are arranged with a predetermined spacing on a fixing web 31. The fixing web 31 has a rail-like construction and extends virtually over the entire width of a functional area wall. A plurality of pins 32 as ribs 12 are fixed in an aligned arrangement (FIG. 15) in the flow direction (cf. arrows A) or in a displaced arrangement (FIG. 16), fixing taking place e.g. by welding, riveting, bonding, clinching, or soldering. The ribs 12 or pins 32 can be fixed with a transverse spacing to the fixing web 31, which corresponds to a longitudinal spacing b or differs therefrom.

Figure 15:
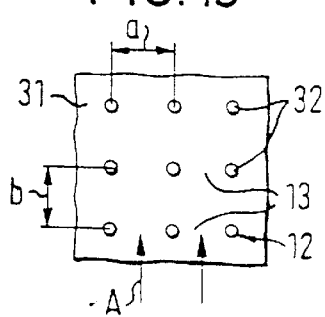
FIG. 15 is a plan view of another variant of a rib rail with a fixing web and ribs arranged in aligned manner.
Figure 16:
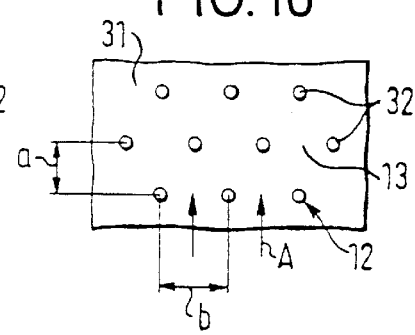
FIG. 16 is a plan view of a rib rail as in FIG. 15, but with displaced ribs.
Figure 17:
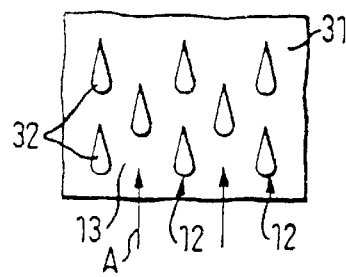
FIG. 17 is a plan view of a detail of a rib rail identical to FIGS. 15 and 16, but with streamlined ribs.

The pin-like ribs 12 can have the circular cross-sections shown in FIGS. 15 and 16, but can also have a rectangular, square or polygonal cross-section or the streamlined cross-section shown in FIG. 17.

Figure 18:
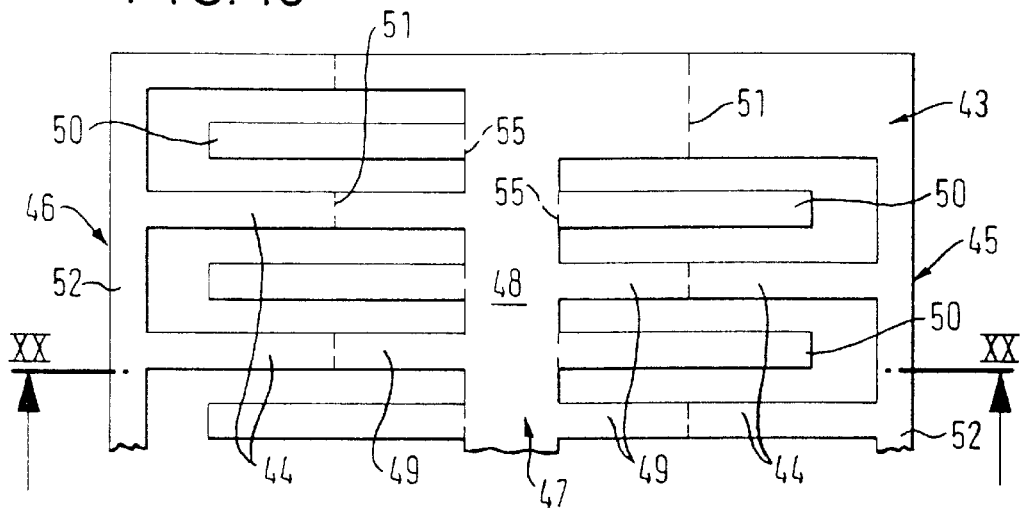
FIG. 18 is a plan view of a double rib rail after the punching process and before bending.
Figure 19:
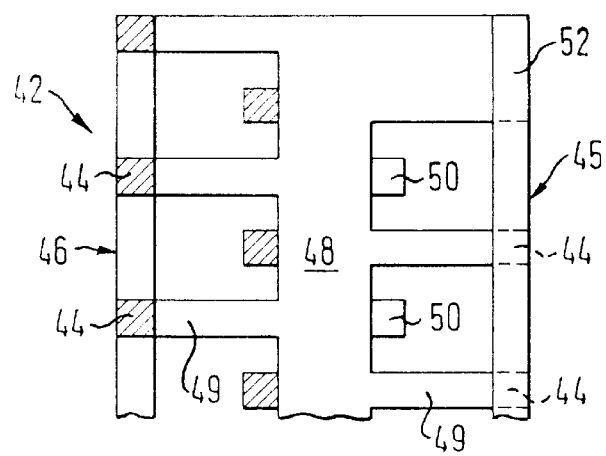
FIG. 19 is a plan view of a double rib rail according to FIG. 18, but after the bending process.
Figure 20:
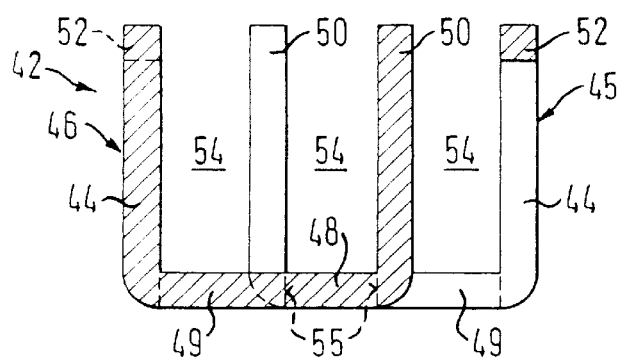
FIG. 20 is a side view of the double rib rail along line XX—XX in FIG. 18.

FIGS. 18 to 20 show a double rib rail 42 which is provided with four lines of ribs 44, 50 and can be manufactured by bending a punched out metal sheet 43 (cf. FIG. 18). The punched out metal sheet 43 and the double rib rail 42 have a central web 47 comprising an uninterrupted web area 48 and connecting areas 49. The central web 47 engages on a functional area wall 6 (cf. FIG. 1).

The connecting areas 49 are formed on the ribs 44 of the rail arms 45, 46 by bending on bending edges 51. Additional ribs indicated as middle ribs 50 are formed by bending on bending edges 53 of the uninterrupted central web 17. It is possible to gather in particular from FIG. 20 that the double rib rail 42 can be manufactured and fixed on a wall of an equipment cabinet, casing, heat exchange etc. in an inexpensive manner.

An outer web 52 of the outside arranged rail arms 45, 46 guarantees the stability of the double rib rail 42. A fluid flow can flow in spaces 54 between the ribs 44 and middle ribs 50 as well as through ports or through holes 55.

What is claimed is:

1. An equipment cabinet for electrical and electronic equipment and components, comprising:
   walls and at least one door surrounding a functional area and terminating said area in a dustproof and watertight manner,
   each of said walls having a multishell construction and comprising at least an outer wall, a functional area wall with a rib system, and an inside guide wall,
   each of said walls forming an inner channel and an outer channel for independent fluid flows for cooling and temperature control of the functional area, and
   rib rails having a plurality of ribs and through ports for fluid flow, forming at least part of the rib system, said rib rails being fixable to the functional area wall.

2. The equipment cabinet according to claim 1, wherein the rib rails are fixed to the functional area wall over substantially its entire height.

3. The equipment cabinet according to claim 2, wherein the rib rails are fixed to the inside and to the outside of the functional area wall.

4. The equipment cabinet according to claim 3, wherein each of said rib rails has a fixing web, wherein pins forming said ribs are fitted by an operation selected from the group of operations consisting of bonding, welding, soldering and clinching, and wherein the pins have a cross-section selected from the group of cross-sections consisting of round, rectangular, square and streamlined cross-sections and the pins are fixed with a selected spacing.

5. The equipment cabinet according to claim 1, wherein the rib rails are U-shaped and arranged with a spacing roughly corresponding to the height of a rib rail.

6. The equipment cabinet according to claim 5, wherein each of said rib rails is made from a perforated metal sheet.

7. The equipment cabinet according to claim 5, wherein each of said rib rails has a lower rail arm and an upper rail arm, which are provided with said ribs and said ports and for engagement and fixing to at least one of the inside and outside of the functional area wall, forming a vertically oriented central web.

8. The equipment cabinet according to claim 7, wherein said ribs and ports are mutually displaced.

9. The equipment cabinet according to claim 7, wherein said ribs and ports are aligned with one another.

10. The equipment cabinet according to claim 1, wherein the ribs and ports are produced by punching and bending.

11. The equipment cabinet according to claim 10, wherein the ribs are direction webs formed by upwardly or downwardly bent or, angled punched areas.

12. The equipment cabinet according to claim 11, wherein the direction webs are angled in the flow direction.

13. The equipment cabinet according to claim 10, wherein the ribs and ports are formed by slots and subsequent bending of punched areas about rotation axes.

14. The equipment cabinet according to claim 1, wherein the ribs and ports are formed by punched areas with punched-out portions.

15. The equipment cabinet according to claim 1, wherein the ribs are formed by marginal recesses, which extend up to an offset bending edge, and the ports are formed between wide sides of the ribs.

16. The equipment cabinet according to claim 1, wherein the rib rails are constructed as double rib rails having provided rail arms and additional middle ribs.

17. The equipment cabinet according to claim 16, wherein the rib rails and the double rib rails are fixed by an operation selected from the group of operations consisting of bonding, welding, soldering and clinching.

18. The equipment cabinet according to claim 16, wherein each of said double rib rails is provided with a central web comprising an uninterrupted web area and connecting areas of said rail arms, and wherein spaces and ports are formed by ribs of outer rail arms of said rail arms and the middle ribs for fluid flow.

19. The equipment cabinet according to claim 1, wherein each of said rib rails is L-shaped and has a vertical fixing web and a horizontal rail arm.

* * * * *